United States Patent [19]
Takeda

[11] Patent Number: 5,923,135
[45] Date of Patent: Jul. 13, 1999

[54] CONTROL APPARATUS AND METHOD FOR MOTOR TO PREVENT MOTOR DRIVE CIRCUIT FROM BEING OVERLOADED

[75] Inventor: Yasushi Takeda, Kawasaki, Japan

[73] Assignee: Nissan Motor Co., Ltd, Kanagawa, Japan

[21] Appl. No.: 08/978,006

[22] Filed: Nov. 25, 1997

[30] Foreign Application Priority Data

Nov. 27, 1996 [JP] Japan .................................. 8-316615

[51] Int. Cl.$^6$ ........................................................ H02P 7/00
[52] U.S. Cl. ........................................... 318/432; 318/433
[58] Field of Search ..................................... 318/432, 433, 318/434, 798, 800, 801, 802, 811; 363/95, 98, 141; 361/24

[56] References Cited

U.S. PATENT DOCUMENTS 5,444,351  8/1995  Yamamura et al. .
5,535,115  7/1996  Kishi et al. .
5,541,494  7/1996  Sannomiya et al. .

FOREIGN PATENT DOCUMENTS 5-115106  5/1993  Japan .
8-191503  7/1996  Japan .

*Primary Examiner*—William M. Shoop, Jr.
*Assistant Examiner*—Rina Ivonne Duda
*Attorney, Agent, or Firm*—McDermott, Will & Emery

[57] ABSTRACT

Described are control apparatus and method for a motor applicable to an electric vehicle in which a motor drive circuit having a plurality of arms, each arm including same series-connected semiconductor switching devices for controllably switching a voltage applied thereacross from a DC power supply so as to apply an AC power to the motor, is associated with the motor, switching operations of the respective semiconductor switching devices so as to regulate a driving of the motor according to a torque instruction inputted thereto are controlled, a temperature having a correlation to a junction temperature of at least one semiconductor switching device is detected, the detected temperature is read, the junction temperature of the semiconductor switching device from the detected temperature is estimated, a determination is made whether the estimated junction temperature is above an allowable limit of the junction temperature, and an output of the motor drive circuit to the motor is adjusted so that the estimated junction temperature is equal to or below the allowable limit on the basis of a result of a determination that the estimated junction temperature is above the allowable limit.

16 Claims, 7 Drawing Sheets

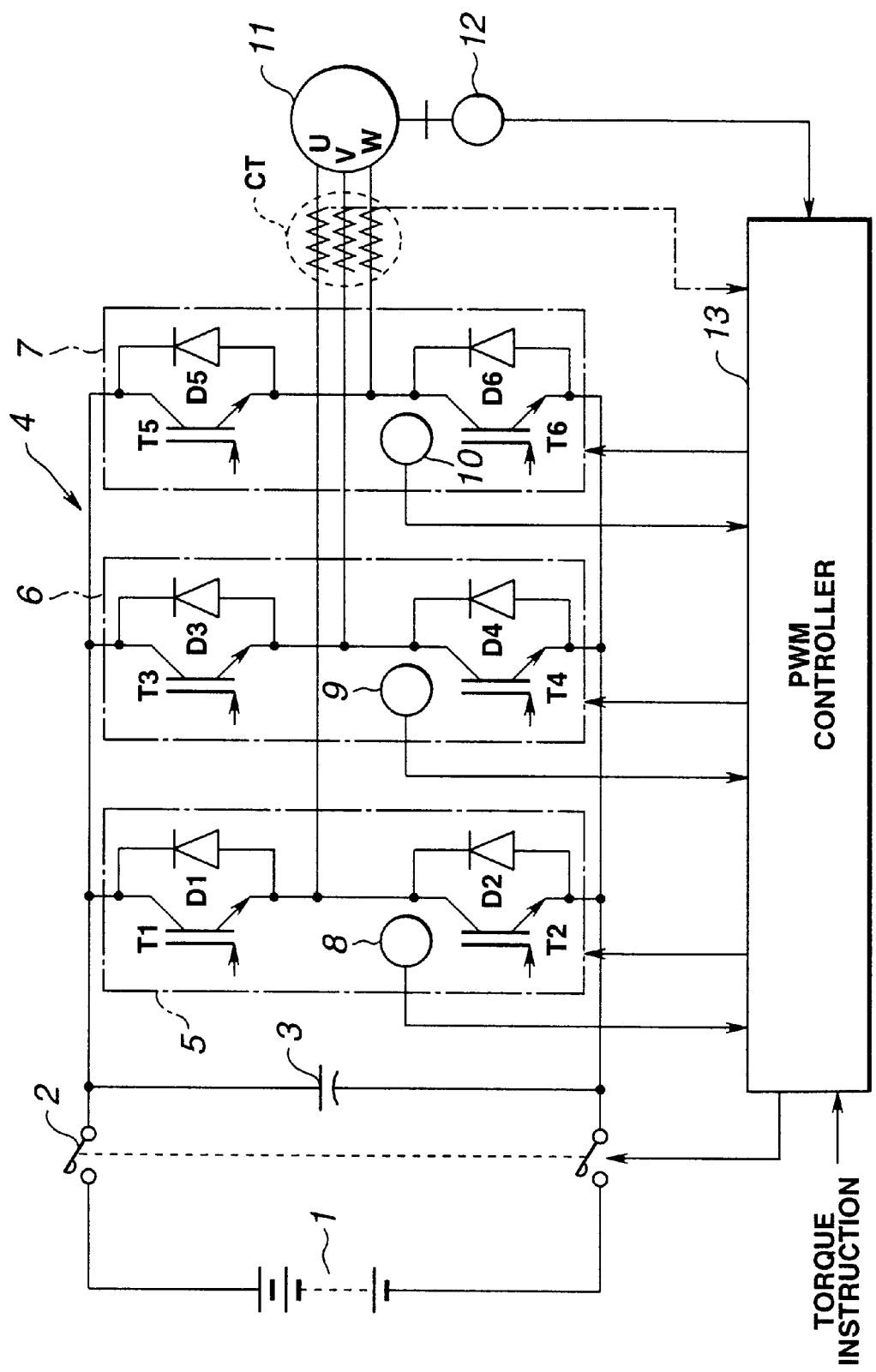

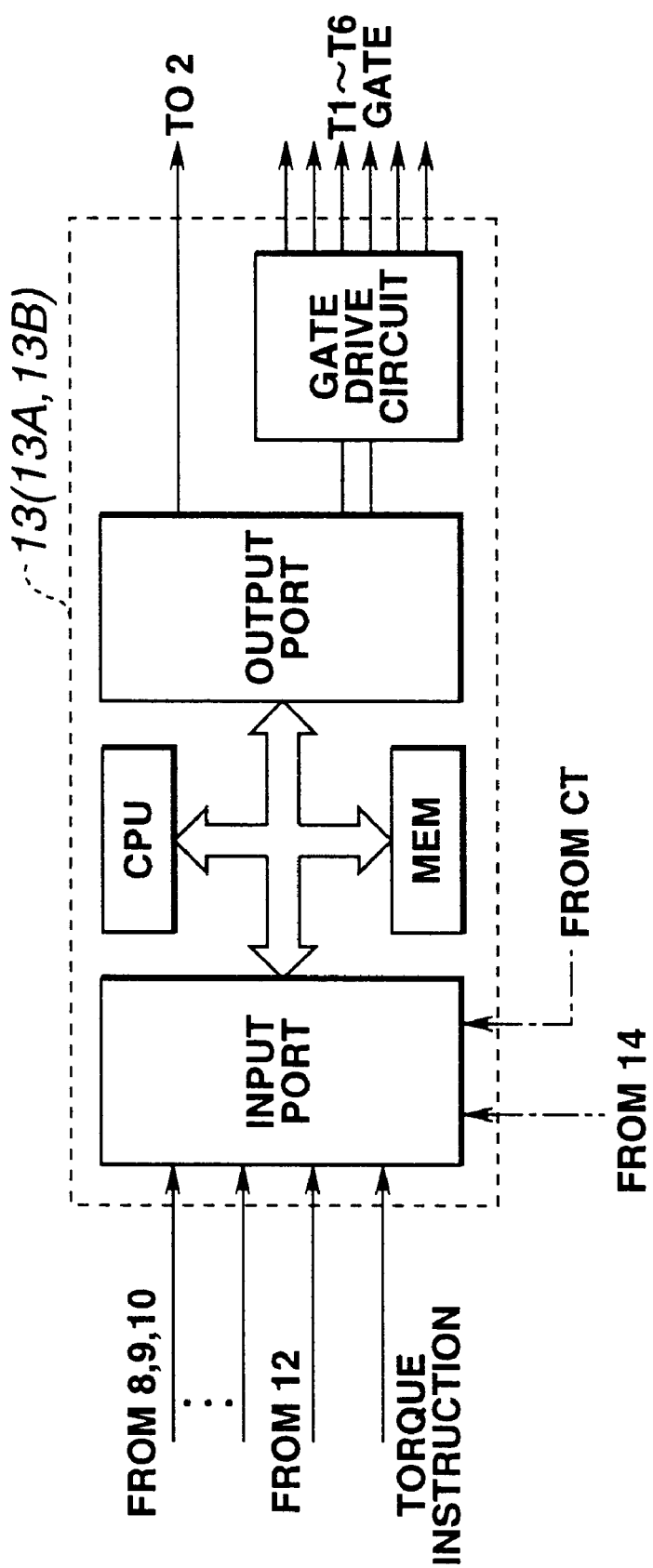

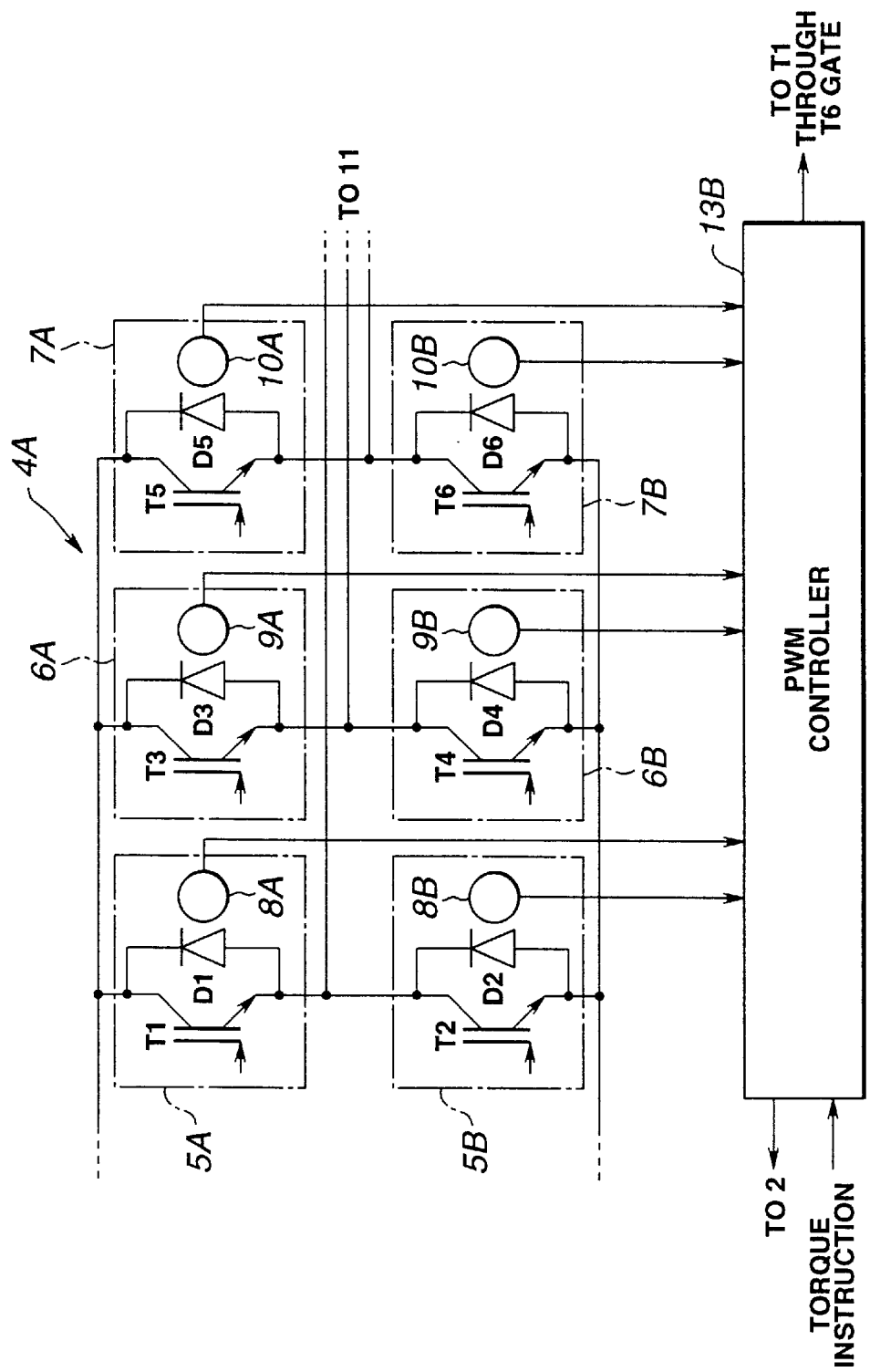

CONTROL APPARATUS AND METHOD FOR MOTOR TO PREVENT MOTOR DRIVE CIRCUIT FROM BEING OVERLOADED

The contents of Application No. Heisei 8-316615, with a filing date of Nov. 27, 1996 in Japan, are herein incorporated by reference.

BACKGROUND OF THE INVENTION a) Field of the Invention

The present invention relates to control apparatus and method for a motor to prevent switching devices of a motor drive circuit from being overloaded applicable to an electric vehicle during a motor halt state or during an extremely low speed running of the motor.

b) Description of the Related Art

In an electric vehicle in which an AC power is supplied from a motor drive circuit to a running motor to drive the motor to run the electric vehicle, an alternating current flows through each semiconductor switching device of the motor drive circuit during a time of a normal revolution of the motor.

However, a DC current flows in a particular switching device during a halt state of the motor or during an extremely low revolution speed of the motor so that a heat loss in the corresponding particular switching device is abruptly increased.

When the motor is revolved at a normal speed, the approximately same current flow occurs through the switching devices so that an even heat loss is distributed over the whole switching devices. In this case, a casing temperature and device junction temperature indicate low values respectively. In addition, a difference in the casing temperature between each switching device is small. However, in a case where the motor is locked so as to be in a halt state or in an extremely low speed running state, the DC current flows through the particular switching device so that an abrupt rise in the casing temperature of the particular switching device occurs. In addition, the difference in each casing temperature is accordingly increased.

In order to prevent each of the junction temperatures in the respective switching devices of the motor drive circuit from exceeding an allowable limit of the junction temperature, a first previously proposed apparatus for preventing an overload on the motor drive circuit has been proposed in which the casing temperature for each switching device is detected, and, when the casing temperature of each of the switching devices exceeds a threshold value thereof, and an output current of the motor drive circuit to the motor is reduced.

The first previously proposed overload preventing apparatus is exemplified by a Japanese Patent Application Fist Publication No. Heisei 5-115106 published on May 7, 1993.

A second previously proposed overload preventing apparatus in which a locked state of the motor is detected and, when the motor becomes the locked state, the output current of the motor drive circuit is limited.

The second previously proposed overload preventing apparatus is exemplified by a Japanese Patent Application First Publication No. Heisei 8-19150 published on Jul. 23, 1996.

SUMMARY OF THE INVENTION

However, if the first previously proposed overload preventing apparatus, when a threshold value T1 which is higher than a device casing temperature during a normal revolution speed range and a continuous maximum drive of the motor is set, the junction temperature of each IGBT at a time at which the device casing temperature is in excess of the threshold value exceeds an allowable limit if the direct current flows through a particular switching device. In order to prevent the overload due to a difference in a thermal time constant between the junction temperature of each switching device and the casing temperature thereof, it is necessary to set the threshold value of the casing temperature to be lower. However, if the threshold value is set to be lower in order to prevent the overload in each IGBT during the motor halt state or during the extremely low revolution speed range, it is necessary to reduce the maximum output during the normal drive since the casing temperature is in excess of the threshold value during the normal revolution speed drive and the continuous maximum drive of the motor.

On the other hand, in the second previously proposed overload preventing apparatus, a load quantity on actual switching devices is not considered. Hence, an overprotection is resulted so that a sufficient output can be provided and on contrary thereto the protection cannot be made any more.

It is therefore an object of the present invention to provide control apparatus and method for a motor to prevent switching devices of a motor drive circuit from being overloaded applicable to an electric vehicle in which a prevention of the overload on each switching device can be assured while a maximum output is maintained even during a lock state of the motor.

The above-described object can be achieved by providing a control apparatus for a motor, comprising: a motor drive circuit having a plurality of arms, each arm including same series-connected semiconductor switching devices for switching a voltage applied thereacross from a DC power supply so as to apply an AC power to the motor; a controller for controlling switching operations of the respective semiconductor switching devices so as to regulate a driving of the motor according to a torque instruction inputted thereto; a detector for detecting a temperature having a correlation to a junction temperature of at least one semiconductor switching device; an estimator for reading the detected temperature and estimating the junction temperature of the semiconductor switching device from the detected temperature; a determinator for determining whether the estimated junction temperature is above an allowable limit of the junction temperature; and an adjuster for adjusting an output of the motor drive circuit to the motor so that the estimated junction temperature is equal to or below the allowable limit on the basis of a result of a determination by the determinator that the estimated junction temperature is above the allowable limit.

The above-described object can also be achieved by providing a control apparatus for a motor, comprising: a motor drive circuit having a plurality of arms, each arm including series-connected semiconductor switching devices for switching a voltage applied thereacross from a DC power supply so as to apply an AC power to the motor; controlling means for controlling switching operations of the respective semiconductor switching devices so as to regulate a driving of the motor according to a torque instruction inputted thereto; detecting means for detecting a temperature having a correlation to a junction temperature of at least one semiconductor switching device; estimating means for reading the detected temperature and estimating the junction temperature of the semiconductor switching device from the detected temperature; determining means for determining whether the estimated junction temperature is above an allowable limit of the junction temperature; and adjusting means for adjusting an output of the motor drive circuit to the motor so that the estimated junction temperature is equal to or below the allowable limit on the basis of a result of the determination by the determining means that the estimated junction temperature is above the allowable limit.

The above-described object can also be achieved by providing a control method for a motor associated with a motor drive circuit having a plurality of arms, each arm including same series-connected semiconductor switching devices for controllably switching a voltage applied thereacross from a DC power supply so as to apply an AC power to the motor, the control method comprising the steps of: controlling switching operations of the respective semiconductor switching devices so as to regulate a driving of the motor according to a torque instruction inputted thereto; detecting a temperature having a correlation to a junction temperature of at least one semiconductor switching device; reading the detected temperature; estimating the junction temperature of the semiconductor switching device from the detected temperature; determining whether the estimated junction temperature is above an allowable limit of the junction temperature; and adjusting an output of the motor drive circuit to the motor so that the estimated junction temperature is equal to or below the allowable limit on the basis of a result of a determination that the estimated junction temperature is above the allowable limit.

BRIEF DESCRIPTION OF THE DRAWINGS

FIG. 1A is a circuit block diagram of a first preferred embodiment of a control apparatus for preventing each semiconductor switching device from being overloaded according to the present invention.

FIG. 1B is a circuit block diagram of a controller shown in FIG. 1A.

FIG. 7A is a circuit block diagram of an alternative of each embodiment of the overload preventing control apparatus.

BEST MODE FOR CARRYING OUT THE INVENTION

Reference will hereinafter be made to the drawings in order to facilitate a better understanding of the present invention.

(First Embodiment)

FIG. 1A shows a first preferred embodiment of a control apparatus for a motor to prevent a motor drive circuit from being overloaded according to the present invention.

FIG. 1B shows a circuit block diagram of a controller shown in FIG. 1A.

Figure 3:
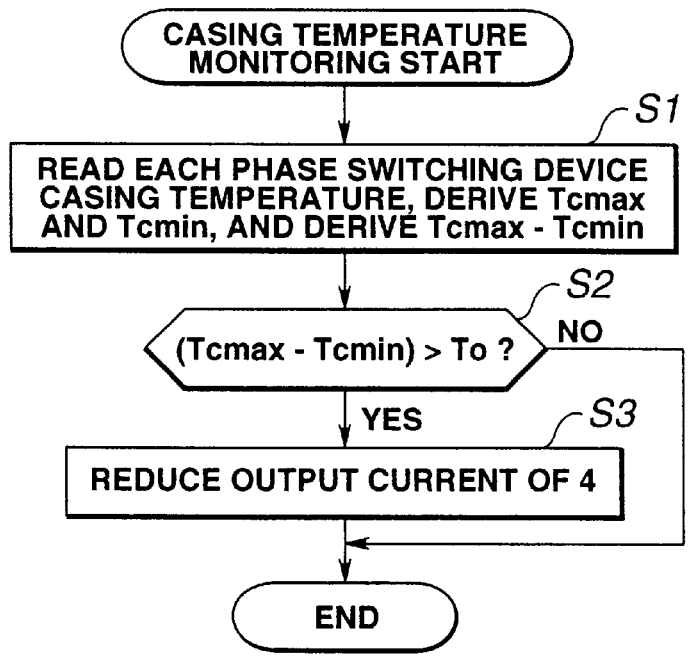
FIG. 3 is an operational flowchart for explaining an operation of the controller in the first embodiment shown in FIGS. 1A and 1B.

FIG. 3 is an operational flowchart for explaining an operation of the overload preventing control apparatus shown in FIG. 1A and FIG. 1B.

A vehicular battery 1 (DC power supply) is connected to an inverter main circuit 4 via an inverter relay 2 and a DC link capacitor 3 so as to enable a supply of the DC power to the inverter main circuit 4. The inverter main circuit 4 inverts the supplied DC power into an alternating current (AC) power and applies the AC power to an induction motor 11 (three phase) used as a prime mover of an electric vehicle.

The inverter main circuit 4 is constituted by a plurality of arms, each arm including same series-connected semiconductor switching devices of IGBTs T1 through T6 and flywheel diodes D1 through D6. The IGBT is an abbreviation for Insulated Gate Bipolar Transistor.

A power module 5 houses U-phase IGBTs T1 and T2 and U-phase flywheel diodes D1 and D2.

A power module 6 houses V-phase IGBTs T3 and T4 and V-phase flywheel diodes D3 and D4.

A power module 7 houses W-phase IGBTs T5 and T6 and W-phase flywheel diodes D5 and D6.

Three temperature sensors constituted by thermisters 8, 9, and 10 detect casing temperatures Tc [° C.] in the U-phase, V-phase, and W-phase power modules 5, 6, and 7, respectively.

It is noted that since, during a normal drive of the motor 11, two series-connected IGBTs T1 and T2, T3 and T4, and T5 and T6, (an emitter of upper one IGBT is connected to a collector of a lower other IGBT) for each of the U-phase, V-phase, and W-phase are not conducted simultaneously, respectively, the temperatures detected by means of the three thermisters 8 through 10 can be deemed to be the casing temperatures of the U-phase IGBTs T1 and T2, the V-phase IGBTs T3 and T4, the W-phase IGBTs T5 and T6 housed in the respective power modules 5, 6, and 7.

A velocity sensor 12 serves to detect a revolution speed Nm [rpm] of a rotor of the motor 11. The motor controller 13 is constituted by a microcomputer having a CPU (Central Processing Unit), a MEM (memory generally constituted by a RAM (Random Access memory) and a ROM (Read Only Memory), a common bus, an Input Port, and an Output Port, and a gate drive circuit, and a peripheral circuit, as shown in FIG. 1B.

In response to a torque instruction from, e.g., an accelerator pedal of the electric vehicle, the motor (PWM) controller 13 controls turning on and off of the IGBTs T1 through T6 of the inverter main circuit 4 and switching on or off of the inverter relay 2. The motor controller 13 is connected with the three thermisters 8, 9, and 10 and the velocity (speed) sensor 12.

In the first embodiment during the drive of the inverter main circuit 4, the controller 13 monitors the casing temperatures Tc of the U-phase, V-phase, and W-phase power modules 5, 6, and 7 in the inverter main circuit 4, determines that the motor 11 is locked when a maximum difference between each phase of the detected casing temperatures Tc exceeds a predetermined threshold value To, and reduces an output of the inverter main circuit 4.

Figure 2:
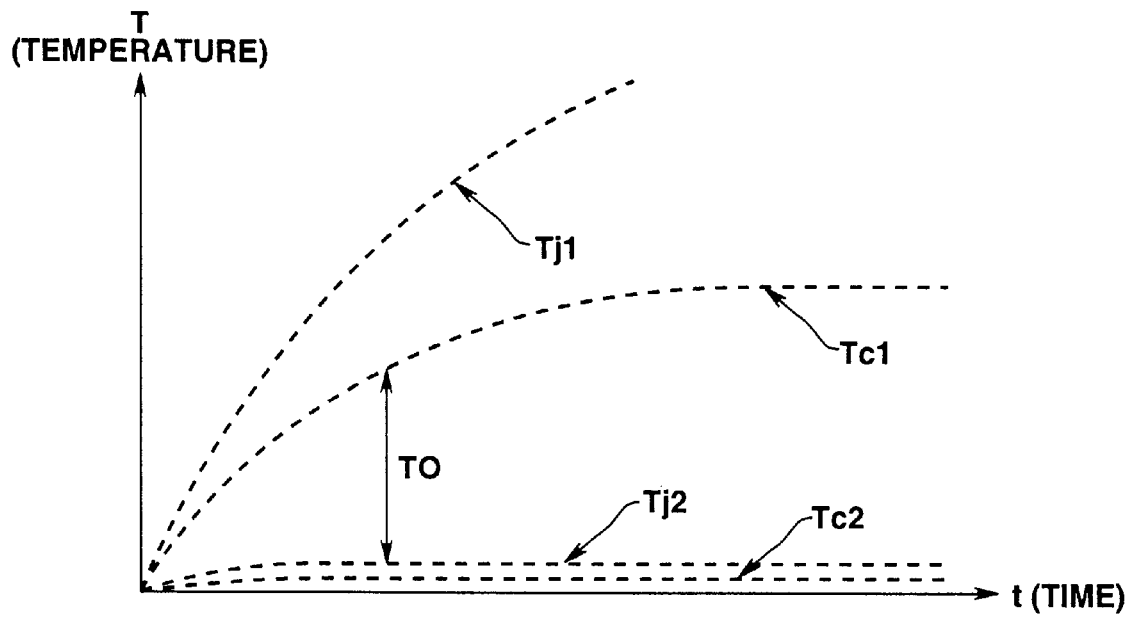
FIG. 2 is a characteristic graph representing a junction temperature of each IGBT shown in FIG. 1A, a maximum casing temperatures and a minimum casing temperature for explaining a predetermined threshold value set in the case of the first embodiment shown in FIG. 1A.

For example, as shown in FIG. 2, the controller 13 adjustably reduces the output (current) of the inverter main circuit 4 so that the difference between a maximum casing temperature Tc1 and a minimum casing temperature Tc2 is equal to or below the threshold value To.

In FIG. 2, Tj1 denotes a junction temperature of one of the IGBTs T1 through T6 whose casing temperature Tc1 is the maximum (Tcmax) and Tj2 denotes a junction temperature of one of the IGBTs T1 through T6 whose casing temperature Tc2 is the minimum (Tcmin).

The threshold value To is by calculation or experimentally set such a value that the junction temperature Tj of one of the IGBTs which indicates the maximum casing temperature has reached to an allowable limit.

As described above, the casing temperatures Tc of the U-phase, V-phase, and the W-phase power modules 5, 6, and 7 can be deemed to the casing temperatures of the respective U, V, and W phases of the inverter main circuit 4. Hence, the output of the inverter main circuit 4 is adjusted so that the maximum temperature difference in the casing temperatures of the respective phase IGBGTs is equal to or below the threshold value T0. Consequently, the output of the inverter main circuit 4 is adjusted to provide a maximum inverter output at which the junction temperature of each IBGT indicates the allowable junction limit. Even during the motor lock state, the overload on the IGBTs T1 through T6 can be prevented while the maximum output (power) is maintained.

It is noted that the adjustment of the output of the inverter is such that an on (or off) duty ratio of a pulse signal applied to each IGBT is modulated so that an average output current of the inverter main circuit 4 is adjusted. The average output current of the inverter main circuit 4 may be detected by means of current detectors CT interposed in the respective phase output ends between the inverter main circuit 4 and the motor 11.

FIG. 3 shows an operational flowchart for explaining the casing temperature monitoring routine executed in the controller 11 in the first embodiment.

The controller 13 executes the casing temperature monitoring routine shown in FIG. 3 whenever a predetermined interval of time has passed.

At a step S1, the CPU of the controller 13 reads the sensed casing temperatures of the power modules 5, 6, and 7 from the thermisters 8, 9, and 10 (,i.e., of the respective U, V, and W-phase IGBTs T1 through T6), derives the maximum casing temperature Tcmax and the minimum casing temperature Tcmin from among the detected casing temperatures Tc, and calculates the difference between the maximum and minimum casing temperatures as (Tcmax−Tcmin).

At a step S2, the CPU of the controller 13 determines whether (Tcmax−Tcmin)>To. If Yes ((Tcmax−Tcmin)>To) at the step S2, the CPU of the controller at a step S3 outputs a command to modify (reduce) the pulse on duty ratio via the gate drive circuit so that the output of the inverter main circuit 4 is adjustably reduced, thus the difference being reduced equal to or below To.

Since, in the first embodiment, the casing temperatures for the respective phase IGBTs are detected and the output of the inverter main circuit 4 is adjusted so that the difference (Tcmax−Tcmin) is equal to or below the threshold value, the prevention to be applied to the IGBTs of the inverter main circuit 4 can be assured while the maximum output of the inverter main circuit 4 is maintained up to the allowable junction temperature limit of each IGBT even during the motor locked state. In addition, the overload of the inverter main circuit 4 can be prevented in the same manner when the motor lock occurs immediately after a continuous maximum output drive of the motor 11.

It is noted that although the adjustment of the inverter main circuit 4 is made only according to the maximum casing temperature difference (Tcmax−Tcmin) in the IGBTs irrespective of the motor revolution speed in the first embodiment, the revolution speed of the motor 11 may be detected by means of the velocity sensor 14 and, when the detected revolution speed of the motor 11 is below another predetermined threshold value (very low speed threshold value) and when the difference in the casing temperature is above the predetermined threshold value ((Tcmax−Tcmin) >To), the output of the inverter main circuit 4 may be adjusted so that (Tcmax−Tcmin)≦To.

As described above, the casing temperature difference in each IGBT is rather small during the normal revolution speed of the motor 11 but during the motor lock state the casing temperature difference becomes abruptly increased. If the threshold value To for the casing temperature difference is set for the extremely low revolution speed of the motor 11 irrespective of the normal revolution speed of the motor 11, the more accurate prevention of the overload to be applied to the IGBTs of the inverter main circuit 4 can be assured during the motor lock state. In addition, a more reliable prevention thereof can be achieved. It is noted that the prevention of the overload in the inverter main circuit during the normal revolution speed of the motor 11 may be carried out with the above-described threshold value set separately from the threshold value of To or may be carried out by another method.

(Second Embodiment)

Figure 4:
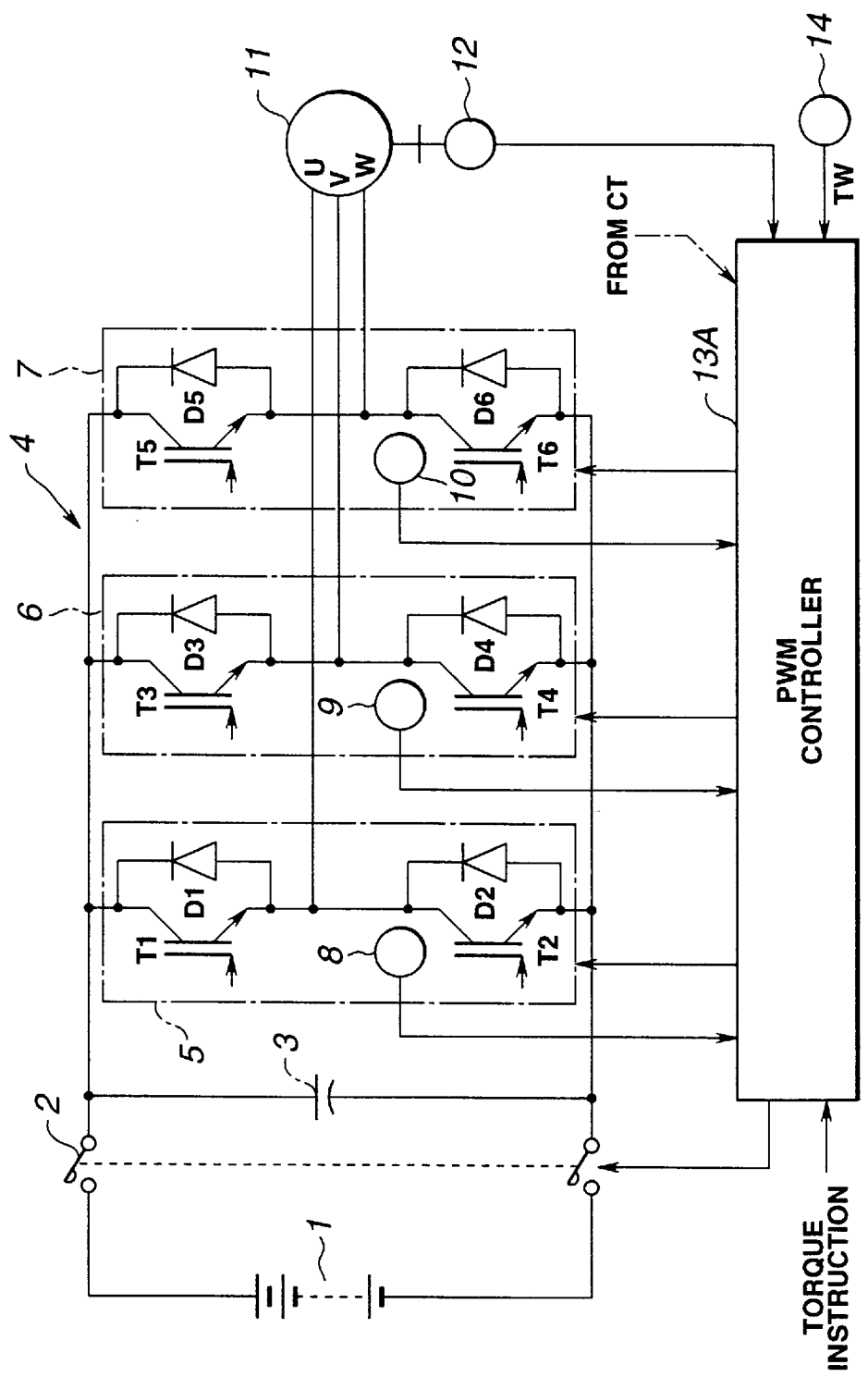
FIG. 4 is a circuit block diagram of the overload preventing control apparatus in a second preferred embodiment according to the present invention.

FIG. 4 shows a second preferred embodiment of the overload preventing control apparatus according to the present invention.

In the second embodiment, the junction temperature Tj of each IGBT in the inverter main circuit 4 is estimated on the basis of each corresponding casing temperature Tc of the IGBTs or on the basis of a coolant temperature Tw of a water-coolant type cooling device disposed on the whole IGBTs of the inverter main circuit 4 and the output current of the inverter main circuit 4 is adjusted on the basis of the estimated junction temperature Tj.

The same reference numerals shown in FIG. 4 designate like elements in FIGS. 1A and 1B.

It is noted that the whole IGBTs T1 through T6 in the inverter main circuit 4 are cooled through the water-coolant type device (not shown). A coolant temperature sensor 14 detects the coolant temperature Tw of the water-coolant type device and outputs the detected coolant temperature Tw to the controller 13A.

Figure 5:
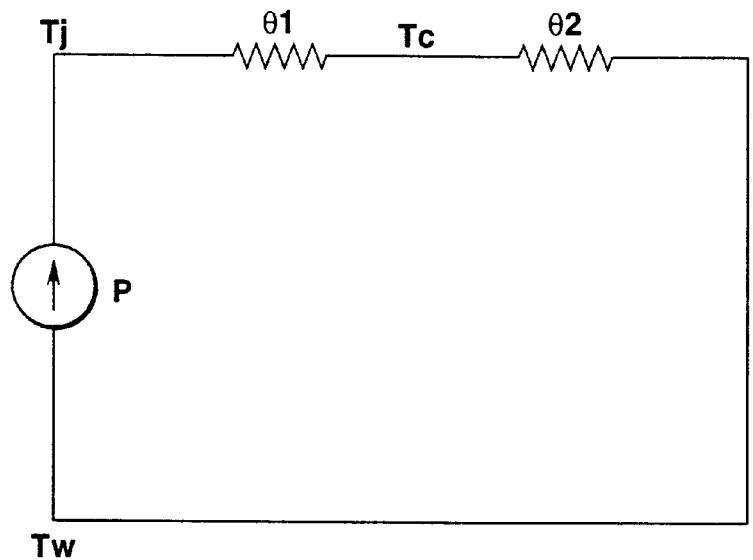
FIG. 5 is a thermal equivalent circuit for explaining the junction temperature of each IGBT in the case of the second embodiment shown in FIG. 4.

FIG. 5 shows a thermal equivalent circuit from the coolant temperature Tw of the water-cooling type cooling device up to the junction temperature Tj of one IGBT.

In FIG. 5, 74 1 denotes a thermal resistance [° C./W] from a junction part of any one of the IGBTs Ti through T6 up to a corresponding power module case, 74 2 denotes a thermal resistance [° C./W] from the power module case up to the coolant, and P denotes a collector loss [W] of the corresponding one IGBT and derived on the basis of the output current of the inverter main circuit 4.

It is noted that, in the second embodiment, a contact thermal resistance between the power module casing and the water-coolant type cooling device is assumed to be included in the value of 74 2.

Since a thermal radiation quantity between the power module casing and an external air is negligibly small as compared with the thermal radiation quantity from the water-coolant type cooling device., The junction temperature Tj of one IGBT can be derived as follows:

$$Tj(Tj11) = P \cdot \theta 1 + Tc \quad (1),$$

and/or $$Tj(Tj22) = P \cdot (\theta 1 + \theta 2) + Tw \quad (2).$$

Figure 6:
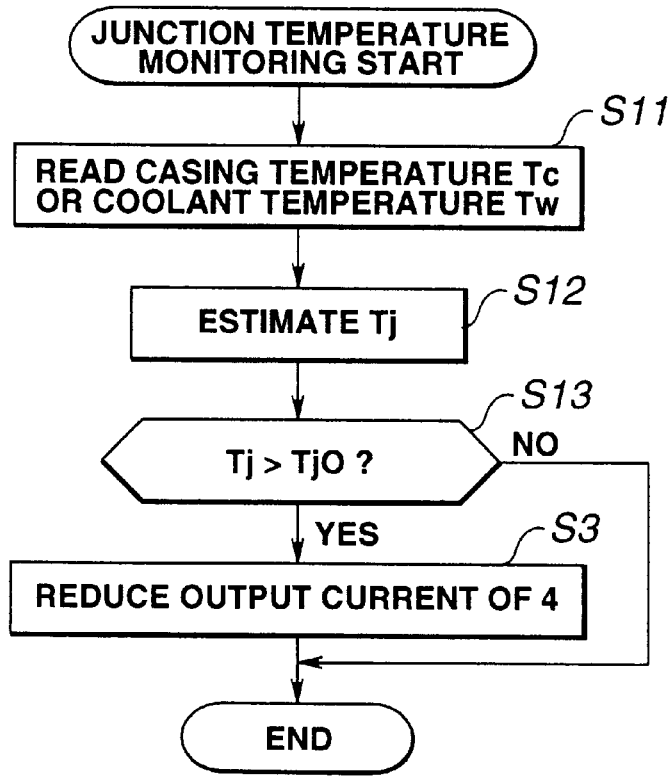
FIG. 6 is an operational flowchart for explaining an operation of the controller in the second embodiment shown in FIG. 4.

FIG. 6 shows an operational flowchart of the junction temperature monitoring routine executed in the motor (PWM) controller 13A.

The CPU of the controller 13A executes the junction temperature monitoring routine whenever the predetermined period of time has passed. At a step S11, the CPU of the controller 13A reads the casing temperatures Tc of the U-phase, V-phase, and W-phase IGBTs T1 through T6 or reads the coolant temperature Tw from the coolant temperature sensor 14. At a step S12, the CPU of the controller 13A estimates the junction temperature Tj of one of the IGBTs using the following equation (1) on the basis of one of the read casing temperatures which indicates the maximum value Tcmax from among the read casing temperatures Tc or using the equation (2) on the basis of the read coolant temperature Tw.

At a step S13, the CPU of the controller 13A determines whether the estimated value Tj of the junction temperature is in excess of the allowable junction temperature Tj0. The output current of the inverter main circuit 4 is adjusted so that the estimated value Tj becomes equal to or below the allowable limit Tj0 when Tj>Tj0 at the step S13. Consequently, while the maximum output of the inverter main circuit 4 is maintained up to the allowable junction temperature limit of each of IGBT even during the lock state of the motor 11, the overload on the IGBTs in the inverter main circuit 4 can be prevented.

Since a thermal transmission route from the junction part of each IGBT to the power module case is short so that an accuracy of the junction temperature estimated value is high although the thermisters 8, 9, and 10 needs to be disposed in the respective phase power modules and the junction temperature Tj is estimated on the basis of the maximum casing temperature Tcmax, a safety operation of each IGBT can be enhanced and an accuracy and a reliability of protection for the IGBTs against the overload can be enhanced.

On the other hand, since the estimation of the junction temperature Tj from the coolant temperature Tw of the water-coolant type cooling device needs only one coolant temperature sensor 14, the manufacturing cost can be reduced.

It is noted as an alternative of the second embodiment, the output of the inverter main circuit 4 may be reduced when either one of the estimated value Tj on the basis of the maximum casing temperature Tcmax or on the basis of the coolant temperature Tw which is greater than the other is in excess of the allowable junction temperature Tj0. Thus, the reliability of the overload preventing apparatus can further be improved.

Figure 7B:
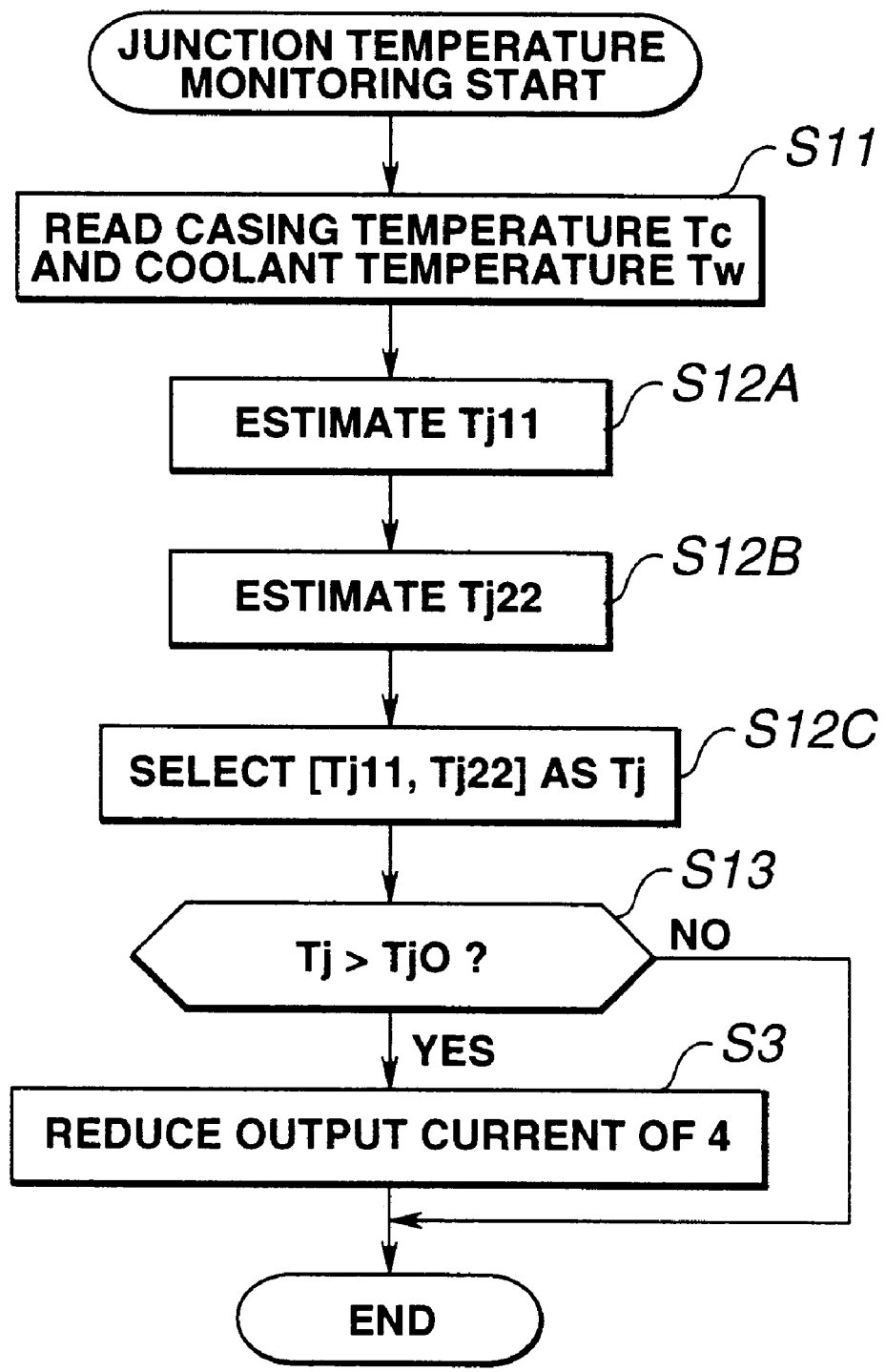
FIG. 7B is an operational flowchart for explaining an operation of the controller as an alternative of the second embodiment shown in FIG. 6.

That is to say, as shown in FIG. 7B, at a step S12A, the CPU of the controller 13A estimates a first estimated value Tj11 from the casing temperature Tc using the equation (1). At a step S12B, the CPU of the controller 13A estimates a second estimated value Tj22 from the coolant temperature Tw using the equation (2). At a step S12C, the CPU of the controller 13A selects a larger value from either the first or second estimated value Tj11 or Tj22 of the junction temperature Tj as Tj. The following steps S13 and S3 are the same as those shown in FIG. 6.

In each of the embodiments, the IGBTs T1 through T6 constitute the semiconductor switching devices, the inverter main circuit 4 (4A) constitutes a motor drive circuit, the thermisters 8, 9, and 10; or 8A, 8B, 9A, or 9B, 10A, or 10B constitutes casing temperature detectors, the PWM (motor) controller 13, 13A, or 13B constitutes a controller and a junction temperature estimator (estimating means), and the coolant temperature sensor 14 constitutes detecting means.

The present invention is applicable to various types of the second switching devices in the inverter main circuit such as bipolar power transistors, MOS-FETs, thyristors, as well as the IGBTs.

In addition, in each embodiment, the casing temperatures Tc are detected from those in the respective phase power modules in the inverter main circuit. However, as an alternative, the inverter main circuit 4A may be constituted by the power modules 5A, 5B, 6A, 6B, 7A, and 7B soley installed for the individual IGBTs T1 through T6.

In this alternative case shown in FIG. 7A, the thermisters 8A, 8B, 9A, 9B, 10A, and 10B may be installed from the respective power modules 5A, 5B, 6A, 6B, 7A, and 7B.

It is noted that the IGBTs for the switching devices in the inverter main circuit are exemplified by a U.S Pat. No. 5,541,494 issued on Jul. 30, 1996, the disclosure of which is herein incorporated by reference.

It is also noted that the motor 11 for the prime mover of the electric vehicle is exemplified by a U.S. Pat. No. 5,444,351 issued on Aug. 22, 1995, the disclosure of which is herein incorporated by reference.

The motor 11 may be constituted by a synchronous type motor although the motor 11 described in each embodiment is constituted by the AC (three-phase) induction motor.

It is also noted that the water-coolant type cooling device described in the second embodiment includes a cooling-fin type heat sink installed over the whole inverter main circuit 4 and a coolant circulating tube disposed over each or any of the cooling fins of the heat sink. Hence, the coolant temperature sensor 14 may be installed in a water supply of the coolant circulating tube.

What is claimed is:

1. A control apparatus for a motor, comprising:
   a motor drive circuit having a plurality of arms, each arm including same series-connected semiconductor switching devices for switching a voltage applied thereacross from a DC power supply so as to apply an AC power to the motor;
   a controller for controlling switching operations of the respective semiconductor switching devices so as to regulate a driving of the motor according to a torque instruction inputted thereto; and
   a detector for detecting a temperature having a correlation to a junction temperature of at least one semiconductor switching device, and wherein the controller includes:
   an estimator for reading the detected temperature and estimating the junction temperature of the semiconductor switching device from the detected temperature;
   a determinator for determining whether the estimated junction temperature is above an allowable limit of the junction temperature; and
   an adjuster for adjusting an output of the motor drive circuit to the motor so that the estimated junction temperature is equal to or below the allowable limit on the basis of a result of a determination by the determinator that the estimated junction temperature is above the allowable limit.

2. A control apparatus for a motor as claimed in claim 1, which further comprises a plurality of power modules installed for each pair of the same semiconductor switching devices, wherein the detector comprises a plurality of temperature sensors for detecting casing temperatures of the respective power modules, wherein the determinator comprises: a second determinator for determining which is a maximum value from among the detected casing temperatures; a third determinator for determining which is a minimum value from among the detected casing temperatures; a fourth determinator for determining a difference between the maximum value and the minimum value; a comparator for comparing the difference with a predetermined threshold value; and a fifth determinator for determining whether the difference is above the predetermined threshold value, and wherein the adjuster adjusts an output current of the motor drive circuit to the motor so as to reduce the difference equal to or below the predetermined threshold value when the fifth determinator determines that the difference is above the predetermined threshold value.

3. A control apparatus for a motor as claimed in claim 2, wherein the predetermined threshold value corresponds to the allowable limit of the junction temperature up to which the junction temperature of one of the semiconductor switching devices whose casing temperature has been detected as the maximum value is allowed to be raised.

4. A control apparatus for a motor as claimed in claim 3, wherein the motor is a three-phase induction motor and the detector comprises three thermisters for detecting the casing temperatures in the respective U, V, and W-phase power modules.

5. A control apparatus for a motor as claimed in claim 2, which further comprises a revolution speed detector for detecting a revolution speed of the motor and a sixth determinator for determining whether the detected revolution speed is so low as to be equal to or below a predetermined speed value and wherein the estimator and the adjuster are effected when the revolution speed of the motor is equal to or below the predetermined speed value.

6. A control apparatus for a motor as claimed in claim 1, which further comprises a plurality of power modules installed for each of the same semiconductor switching devices, wherein the detector comprises a plurality of temperature sensors for detecting casing temperatures of the respective power modules, wherein the determinator comprises: a second determinator for determining which is a maximum value from among the detected casing temperatures; a third determinator for determining which is a minimum value from among the detected casing temperatures; a fourth determinator for determining a difference between the maximum value and the minimum value; a comparator for comparing the difference with a predetermined threshold value; and a fifth determinator for determining whether the difference is above the predetermined threshold value, and wherein the adjuster adjusts an output current of the motor drive circuit to the motor so as to reduce the difference equal to or below the predetermined threshold value when the fifth determinator determines that the difference is above the predetermined threshold value.

7. A control apparatus for a motor as claimed in claim 1, which further comprises a plurality of power modules installed for each pair of the same semiconductor switching devices and wherein the detector comprises a plurality of temperature sensors for detecting casing temperatures of the respective power modules and the estimator estimates the junction temperature of the one of the semiconductor switching devices whose corresponding casing temperature is a maximum from among the detected casing temperatures.

8. A control apparatus for a motor as claimed in claim 1, water cooling motor drive circuit and the estimator estimates the junction temperature of the one of the semiconductor switching devices from the detected coolant temperature.

9. A control apparatus for a motor as claimed in claim 1, which further comprises a plurality of power modules installed for each pair of the same semiconductor switching devices and wherein the detector comprises a plurality of temperature sensors for detecting casing temperatures of the respective power modules and the estimator comprises a first estimator for estimating the junction temperature ($Tj11$) of the one of the semiconductor switching devices whose corresponding casing temperature is a maximum ($Tcmax$) from among the detected casing temperatures, and and wherein the detector comprises a coolant temperature sensor for detecting a coolant temperature of water cooling motor drive circuit, the estimator further comprises a second estimator for estimating the junction temperature ($Tj22$) of one of the semiconductor switching devices from the detected coolant temperature ($Tw$), and the determinator further comprises a second determinator for determining which one of the estimated junction temperatures ($Tj11$ or $Tj22$) by the first and second estimators is larger than the other thereof and for determining that the larger one of the estimated junction temperature is the estimated junction temperature ($Tj$).

10. A control apparatus for a motor as claimed in claim 1, which further comprises a plurality of power modules installed for each of the same semiconductor switching devices and wherein the detector comprises a plurality of temperature sensors for detecting casing temperatures of the respective power modules and the estimator estimates the junction temperature of the one of the semiconductor switching devices whose corresponding casing temperature is a maximum from among the detected casing temperatures.

11. A control apparatus for a motor as claimed in claim 9, wherein the motor is a three-phase motor used for an electric vehicle as a prime mover and each semiconductor switching device comprises an IGBT.

12. A control apparatus for a motor as claimed in claim 11, which further comprises a current detector for detecting an output current of the motor drive circuit and wherein the first estimator estimates the junction temperature from one of the detected casing temperatures which indicates the maximum using the following equation:

$$Tj(Tj11) = P \cdot \theta1 + Tc,$$

wherein P denotes a collector loss of the IGBT derived on the basis of the output current of the motor drive circuit, $\theta1$ denotes a thermal resistance established between a junction part of the IGBT and a casing of the corresponding one of the power modules, and $Tc = Tcmax$ and the second estimator estimates the junction temperature of the IGBT from the coolant temperature ($Tw$) using the following equation:

$$Tj(Tj22) = P \cdot (\theta1 + \theta2) + Tw,$$

wherein $\theta2$ denotes a thermal resistance established between the coolant and the casing of the corresponding one of the power modules.

13. A control apparatus for a motor as claimed in claim 12, wherein the adjuster adjustably reduces the output current of the motor drive circuit so that the estimated junction temperature is equal to or below the allowable limit when the determinator determines that the estimated junction temperature is above the allowable limit.

14. A control apparatus for a motor as claimed in claim 13, wherein the adjuster adjustably reduces an on duty ratio of a pulse signal to be applied to each gate of the IGBTs so as to adjustably reduce the output current of the motor drive circuit to the motor.

15. A control apparatus for a motor, comprising:

a motor drive circuit having a plurality of arms, each arm including series-connected semiconductor switching devices for switching a voltage applied thereacross from a DC power supply so as to apply an AC power to the motor;

controlling means for controlling switching operations of the respective semiconductor switching devices so as to regulate a driving of the motor according to a torque instruction inputted thereto;

detecting means for detecting a temperature having a correlation to a junction temperature of at least one semiconductor switching device;

estimating means for reading the detected temperature and estimating the junction temperature of the semiconductor switching device from the detected temperature;

determining means for determining whether the estimated junction temperature is above an allowable limit of the junction temperature; and adjusting means for adjusting an output of the motor drive circuit to the motor so that the estimated junction temperature is equal to or below the allowable limit on the basis of a result of the determination by the determining means that the estimated junction temperature is above the allowable limit.

16. A control method for a motor associated with a motor drive circuit having a plurality of arms, each arm including same series-connected semiconductor switching devices for controllably switching a voltage applied thereacross from a DC power supply so as to apply an AC power to the motor, the control method comprising the steps of:

controlling switching operations of the respective semiconductor switching devices so as to regulate a driving of the motor according to a torque instruction inputted thereto;

detecting a temperature having a correlation to a junction temperature of at least one semiconductor switching device;

reading the detected temperature;

estimating the junction temperature of the semiconductor switching device from the detected temperature;

determining whether the estimated junction temperature is above an allowable limit of the junction temperature; and adjusting an output of the motor drive circuit to the motor so that the estimated junction temperature is equal to or below the allowable limit on the basis of a result of a determination that the estimated junction temperature is above the allowable limit.

\* \* \* \* \*